(12) United States Patent
van Winkelhoff et al.

(10) Patent No.: US 7,613,053 B2
(45) Date of Patent: Nov. 3, 2009

(54) MEMORY DEVICE AND METHOD OF OPERATING SUCH A MEMORY DEVICE

(75) Inventors: Nicolaas Klarinus Johannes van Winkelhoff, Villard-Bonnot (FR); Sebastien Nicolas Ricavy, Saint Martin D'Heres (FR); Christophe Denis Lucien Frey, Meylan (FR); Denis René André Dufourt, Meylan (FR); Vincent Philippe Schuppe, Austin, TX (US)

(73) Assignee: ARM Limited, Cambridge (GB)

( * ) Notice: Subject to any disclaimer, the term of this patent is extended or adjusted under 35 U.S.C. 154(b) by 74 days.

(21) Appl. No.: 11/984,885

(22) Filed: Nov. 23, 2007

(65) Prior Publication Data

US 2009/0135663 A1 May 28, 2009

(51) Int. Cl.
*G11C 5/14* (2006.01)

(52) U.S. Cl. .......................... 365/189.09; 365/189.011; 365/189.11; 365/185.18; 365/185.25; 365/226

(58) Field of Classification Search ............ 365/189.09, 365/189.011, 189.11, 203, 204, 205, 226, 365/149, 185.25, 185.18
See application file for complete search history.

(56) References Cited

U.S. PATENT DOCUMENTS

| 6,411,560 | B1 * | 6/2002 | Tanizaki et al. ............. 365/227 |
| 2002/0167849 | A1 * | 11/2002 | Ohbayashi et al. ..... 365/189.09 |
| 2005/0088881 | A1 * | 4/2005 | Miki et al. ............. 365/189.09 |

OTHER PUBLICATIONS

Zhang K., et al., "A 3-GHz 70 Mb SRAM in 65nm CMOS Technology with Integrated Column-Based Dynamic Power Supply", Digest of Technical Papers, ISSCC 2005/Session 26/Non-Volatile Memory/ 26.1, pp. 474-475 and 611, (2005).

Pilo Harold, et al., "An SRAM Design in 65-nm Technology Node Featuring Read and Write-Assist Circuits to Expand Operating Voltage", IEEE Journal of Solid-State Circuits, vol. 42, No. 4, pp. 813-819, (Apr. 4, 2007).

(Continued)

*Primary Examiner*—Richard Elms
*Assistant Examiner*—Eric Wendler
(74) *Attorney, Agent, or Firm*—Nixon & Vanderhye P.C.

(57) ABSTRACT

A memory device and method of operation are provided. The memory device comprises a plurality of memory cells arranged in at least one column, during a write operation a data value being written to an addressed memory cell within a selected column from said at least one column. A supply voltage line is associated with each column, the supply voltage line being connectable to a first voltage source to provide a supply voltage at a first voltage level to the associated column. Threshold circuitry is connected to a second voltage source having a second voltage level, the threshold circuitry having a threshold voltage. Control circuitry is used during the write operation to disconnect the supply voltage line for the selected column from the first voltage source, and to connect the threshold circuitry to the supply voltage line for the selected column. As a result, the supply voltage to the addressed memory cell transitions to an intermediate voltage level determined by the threshold voltage of the threshold circuitry, thereby de-stabilizing the addressed memory cell and assisting in the write operation. The technique of the present invention provides a particularly simple and power efficient technique for implementing a write assist mechanism.

14 Claims, 8 Drawing Sheets

OTHER PUBLICATIONS

Pilo, Harold et al., "An SRAM Design in 65nm and 45nm Technology Nodes Featuring Read and Write-Assist Circuits to Expand Operating Voltage", 2006 Symposium on VLSI Circuits Digest of Technical Papers, 2 pages, (2006).

Ohbayashi, Shigeki et al., "A 65-nm SoC Embedded 6T-SRAM Designed for Manufacturability with Read and Write Operation Stabilizing Circuits", IEEE Journal of Solid-State Circuits, vol. 42, No. 4, pp. 820-829, (Apr. 4, 2007).

Yabuuchi, Makoto, et al., "A 45nm Low-Standby-Power Embedded SRAM with Improved Immunity Against Process and Temperature Variations", Digest of Technical Papers, ISSCC 2007/Session 18/SRAM/18.3, pp. 326-327 and 606, (2007).

Hobson, Richard F., "A New Single-Ended SRAM Cell with Write-Assist", IEEE Transactions on Very Large Scale Integration (VLSI) Systems, vol. 15, No. 2, pp. 173-181, (Feb. 2, 2007).

* cited by examiner

MEMORY DEVICE AND METHOD OF OPERATING SUCH A MEMORY DEVICE

BACKGROUND OF THE INVENTION

1. Field of the Invention

The present invention relates to a memory device and method of operating such a memory device, and in particular to techniques that can be employed when performing memory access operations to assist those memory access operations.

2. Description of the Prior Art

There is an increasing demand for memory devices to be constructed which are smaller and consume less power than their predecessor designs, whilst retaining high performance. New technologies are being developed which allow a reduction in size of the individual transistors making up each memory cell. However, as the memory cells decrease in size, the variation in behaviour between individual memory cells tends to increase, and this can adversely affect predictability of operation. This variation in operation of the individual memory cells can give rise to significant failure rates when trying to run the memory devices at high speed to meet the performance requirements. It is often also the case that there is a desire to use a lower power supply voltage for the memory device in order to reduce power consumption, but this can further increase the likelihood of failed operation within individual memory cells. Accordingly, in modern technologies, it is becoming more and more difficult to produce memory devices where the individual memory cells have the required stability to ensure effective retention of data (stability sometimes being measured in terms of static noise margin (SNM)), whilst also having required write-ability (WM) to ensure that new data values can be stored in the cells within the time period allowed for a write operation.

Faced with these issues, various assistance mechanisms have been developed which seek to assist individual memory cells in operating correctly when write and read operations are performed on those cells. For example, the article "A 3-GHz 70 Mb SRAM in 65 nm CMOS Technology with Integrated Column-Based Dynamic Power Supply" by K Zhang et al, Intel, published in ISSCC 2005, Session 26, describes a six transistor SRAM cell (often referred to as a 6T SRAM cell) which is stable in all conditions, but requires write assist (WA) circuitry to improve the likelihood of individual cells operating correctly when written to. The write assist circuitry disclosed in this article is illustrated schematically in FIG. 1, and is based on the idea of lowering the supply voltage to an addressed memory cell just prior to the write operation, the lower supply voltage lowering the stability of the memory cell, and therefore making it more easy to write into.

FIG. 1 shows an array of memory cells 240, 242, 244, 246, 248, 250, 252, 254 provided in association with a particular column multiplexer 260 of the memory array. Each row is addressed by a word line 200, 202, and each column has a power supply voltage provided by a supply voltage line 230, 232, 234, 236. As is known in the art, each of the columns also has a pair of bit lines 210, 212, 214, 216, 218, 220, 222, 224 associated therewith. From an address provided to the memory device, a row and column within the memory device is identified, with the addressed memory cell being the memory cell at the intersection between the identified row and column. For a read operation, the word line 200, 202 associated with the selected row is selected in order to enable a row of cells, and then the column multiplexer 260 outputs to the sense amplifier 270 an indication of the voltages on the pair of bit lines associated with the selected column to allow the sense amplifier to detect the value stored in the addressed memory cell. For a write operation, the word line is enabled in the same manner, and the voltage on one of the pair of bit lines associated with the selected column is then discharged to identify the data value to be stored in the addressed memory cell.

As shown in FIG. 1, associated with each supply voltage line, a multiplexer 262, 264, 266, 268 is provided which can select between a main supply voltage on path 275 and a specially generated lower column supply voltage provided over path 280. Just prior to the write operation, the relevant multiplexer 262, 264, 266, 268 associated with the selected column is driven to select, as the voltage output on the supply voltage line for that column, the reduced column supply voltage received over path 280. Hence, by way of example, if cell 240 is to be written to, then multiplexer 262 will output the lower column supply voltage received over path 280 to the supply voltage line 230. This will assist in performing the write operation with respect to the addressed memory cell 240. The other memory cells 248 in the selected column are not activated, since their associated word lines have not been enabled, and accordingly retain their held data values. For the other memory cells 242, 244, 246 coupled to the enabled word line 200, the supply voltage lines 232, 234, 236 are retained at the normal main supply voltage provided over path 275, since otherwise they could become unstable.

By such an approach, a higher yield can be produced, since memory cells that might otherwise fail the write-ability requirements can be caused to pass the required write-ability requirements by virtue of the reduced supply voltage used during the write operation. However, the implementation disclosed in FIG. 1 has a number of problems. Firstly, the time available to lower the supply voltage during the write operation is extremely limited, due to the short time available for performing write operations in high performance memory devices. The charge that needs to be dissipated when reducing the voltage on the supply line hence leads to large current peaks. Further, the memory requires for every output bit the use of a column with the supply voltage lowered, and this accordingly increases the current peak problem mentioned above.

Further, the design of FIG. 1 requires a dedicated voltage generator to produce the extra reduced column supply voltage over path 280, and this either needs to be accommodated within the design of the memory device, or else provided externally, with additional metal lines being provided to route the voltage supply from that voltage generator. For any change in height or width of the memory device, the capacitances observed on the various column supply voltage lines will change, and this will typically require a redesign or tuning of the voltage generator used to generate the extra column supply voltage on path 280, to ensure that the voltage on the column supply voltage line can be reduced sufficiently quickly in the short period of time allowed before the write occurs to the addressed memory cell. Such voltage generators will also be susceptible to temperature and voltage variations, which may require correcting circuits to be added.

In addition to these problems, in memory devices designed for low power applications, the presence of the additional voltage generator leads to significant power consumption since the additional voltage supply must be maintained at all times to enable that supply voltage to be available ahead of any write operation.

In the articles "An SRAM Design in 65-nm Technology Node Featuring Read and Write-Assist Circuits to Expand Operating Voltage" by H Pilo et al, IEEE Journal of Solid- State Circuits, Volume 42, No. 4, April 2007, and "An SRAM Design in 65 nm and 45 nm Technology Nodes Featuring Read and Write-assist Circuits to Expand Operating Voltage" by H Pilo et al, 2006 Symposium on VLSI Circuits, Digest of Technical Papers, a write-assist feature is described which also makes use of an additional column supply voltage (referred to in the articles as VWR) for coupling to a column containing an addressed memory cell to be written to. In accordance with the technique described therein, a special onboard voltage generator is provided for globally generating the VWR voltage from the VDD supply voltage. This onboard voltage generator uses a push-pull transistor stage in order to generate the VWR voltage level. Band gap reference circuits are also used for the push-pull transistor stage. A disadvantage of such an approach is that a significant DC current is produced by the band gap generator circuitry used, and power is lost in charging and discharging the column supply line with different voltages every write cycle. Hence, such an approach is likely to be unacceptable in many memory devices, for example those designed for low power applications. Further, the band gap generator and push-pull transistor stage consume valuable space within the memory device.

The article "A 65-nm SoC Embedded 6T-SRAM Designed for Manufacturability with Read and Write Operation Stabilizing Circuits" by S Ohbayashi et al, IEEE Journal of Solid-State Circuits, Volume 42, No. 4, April 2007, describes a capacitive write assist circuit, where an additional metal line (referred to as the downvdd line in the article) is formed in a fourth metal layer, and preset to ground potential. During the write operation that downvdd line is connected to the relevant column supply voltage line in a second metal layer to cause charge redistribution to occur between the connected column supply voltage line and the downvdd line, leading to a drop in voltage on the column supply voltage line. Whilst this approach can reduce the voltage on the column supply voltage line very quickly, it does require the provision of an extra metal line within the memory circuit, along with the use of a pre-charge circuit in association with that extra line to precharge that line to a ground level, giving rise to power loss associated with such precharge circuits. The provision of such an additional line is likely to increase cost, and may prove difficult to incorporate within high density memory designs. Further, the increase in power consumption associated with the precharge circuits provided for that additional line may be unacceptable in certain memory devices, for example those designed for low power applications.

The article "A 45 nm Low-Standby-Power Embedded SRAM with Improved Immunity Against Process and Temperature Variations" by M Yabuuchi et al, published in ISSCC 2007, Session 18, describes a similar write assist circuit making use of an additional line to share charge with the selected column supply voltage line during a write operation.

The article "A New Single-Ended SRAM Cell with Write-Assist" by R Hobson, IEEE Transactions on Very Large Scale Integration (VLSI) Systems, Volume 15, No. 2, February 2007, describes a 6T SRAM cell with a write-assist feature. A single-ended I/O (SEIO) bit line variation on the 6T SRAM structure is proposed where both reading and writing take place over a common SEIO bit line, and a floating ground line is used in place of the traditional second bit line. During a write operation, the floating ground line is selectively connected to one of the internal nodes of the memory cell to improve write-one performance. The disadvantages of such an approach are that it involves a significant modification to the standard SRAM memory cell, results in a non-regular layout which may prove difficult to implement, and will result in a slow read operation due to the use of a single bit line.

Accordingly, it would be desirable to provide an improved form of assist mechanism for use in a memory device, which is simpler, and consumes less power, than the known prior art techniques.

SUMMARY OF THE INVENTION

Viewed from a first aspect, the present invention provides a memory device comprising: a plurality of memory cells arranged in at least one column, during a write operation a data value being written to an addressed memory cell within a selected column from said at least one column; a supply voltage line associated with each of said at least one columns, the supply voltage line being connectable to a first voltage source to provide a supply voltage at a first voltage level to the associated column; threshold circuitry connected to a second voltage source having a second voltage level, the threshold circuitry having a threshold voltage; and control circuitry, responsive to the write operation, to disconnect the supply voltage line for the selected column from the first voltage source for a predetermined period of the write operation, and during said predetermined period to connect the threshold circuitry to the supply voltage line for the selected column, such that the supply voltage to the addressed memory cell transitions to an intermediate voltage level determined by the threshold voltage of the threshold circuitry.

In accordance with the present invention, threshold circuitry is provided within the memory device which, via control circuitry, is connected to the supply voltage line of the selected column for a predetermined period of the write operation. During that period of time, the control circuitry also ensures that the supply voltage line of the selected column is disconnected from the first voltage source, the combination of these two steps causing the supply voltage to the addressed memory cell to transition to an intermediate voltage level determined by the threshold voltage of the threshold circuitry.

It has been found that such a technique provides a quick and effective mechanism for reducing the supply voltage to the addressed memory cell from the first voltage level to the intermediate voltage level, thus de-stabilising the addressed memory cell and assisting the write operation. It has been found that the threshold circuitry can very quickly discharge the charge held on the selected column so as to quickly reduce the voltage level to the intermediate voltage level. Further, the technique can be executed on a local level, for example in each selected column.

When compared with the earlier discussed prior art requiring the provision of a additional column supply voltage, along with associated voltage generator circuitry to generate that additional column supply voltage, the technique of the present invention consumes significantly less power and is simpler to implement. When compared with the earlier-mentioned techniques that provide an additional metal line to share charge with the selected column supply voltage line during a write operation, the approach of the present invention is typically cheaper and simpler to implement by avoiding the need for provision of such additional metal lines, and further is more power efficient by avoiding the need to provide precharge circuits for those additional metal lines. Further, the technique of the present invention can be used be used with standard SRAM memory cells, thereby avoiding the disadvantages associated with the non-regular layout and slow read operation of the memory cell described in the earlier-mentioned article "A New Single-Ended SRAM Cell with Write-Assist".

Depending on how the write operation is implemented, the predetermined period of the write operation for which the supply voltage line is disconnected from the first voltage source may be the entire period of the write operation, or some particular portion of the time taken to perform the write operation.

Depending on how the various memory cells are arranged to operate, including factors such as whether the bit lines within the memory device are precharged to a high voltage level or precharged to a low voltage level, the supply voltage line which is controlled by the control circuitry may be either the power supply voltage line connected to a power supply voltage source, or a ground supply voltage line connected to a ground voltage source. However, in typically memory devices, the manner in which the memory cells operate will be such that the supply voltage line controlled by the control circuitry will be the power supply voltage line. Accordingly, in such embodiments, the first voltage level is a power supply voltage level, and the second voltage level is a ground supply voltage level.

The plurality of memory cells within the memory device can be arranged in a variety of ways. In one embodiment, the plurality of memory cells are arranged as a memory array comprising a plurality of rows and a plurality of columns, during the write operation a selected row from said plurality being enabled to identify the addressed memory cell in the selected column.

The threshold circuitry can take a variety of forms, provided that it has a threshold voltage that will serve to establish the intermediate voltage level as the supply voltage to the addressed memory cell when the control circuitry connects the threshold circuitry to the supply voltage line for the selected column. Circuitry which readily lends itself to such functionality is diode circuitry. Forward biased diode circuitry will provide the required threshold voltage and hence can readily achieve the desired functionality when connected to the supply voltage line by the control circuitry. In particular, diode circuitry will quickly discharge all of the charge on the supply voltage line to the second voltage level (typically ground), this process continuing until the potential difference across the diode circuitry reaches the threshold voltage, at which point the supply voltage to the addressed memory cell will have transitioned to the intermediate voltage level.

Whilst various types of diode circuitry could be used, in one embodiment the diode circuitry comprises an electrostatic discharge (ESD) diode circuitry. ESD diode circuitry has been found to be particularly suitable for embodiments of the present invention, since such circuitry can discharge the voltage on the supply voltage line very quickly and hence can readily provide the required functionality within the relatively small period of time allowed for reducing the voltage on the supply voltage line before the writing of the memory cell takes place.

In one embodiment, the diode can be tuned with respect to its threshold voltage and/or its impedance, for example to give a transfer curve that has a very low impedance above the threshold voltage. The diode threshold voltage or diode input impedance could be tuned at technology development time. In addition, or alternatively, the threshold voltage could be tuned after design time using techniques such as backbiasing.

The threshold circuitry (whether provided as diode circuitry or otherwise), can be arranged in a variety of ways. In one embodiment, the diode circuitry may be replicated for each column. However, in an alternative embodiment, the memory array comprises a plurality of sections, each section having said plurality of columns and an associated column multiplexer connected to said plurality of columns, the threshold circuitry being replicated for each section but being shared amongst the plurality of columns in each section. This can provide a more efficient solution than replicating the diode circuitry for each of the columns, since it enables a larger threshold circuit to be provided, thereby typically reducing the resistance of that circuitry and hence enabling a higher current flow through the threshold circuitry. By enabling a higher current flow through the threshold circuitry, this improves the speed with which the voltage on the supply voltage line can be discharged to the intermediate voltage level. The high current drawn during this period is distributed since the threshold circuitry is shared amongst the plurality of columns in each section.

In a further alternative embodiment, the threshold circuitry may be shared amongst the plurality of sections rather than having separate threshold circuitry for each section. This may simplify manufacture in certain situations. Further spreading the sink current will be better for electro migration and self heating.

In a typical memory device, certain leakage current will be associated with the various memory cells, and leakage current typically increases with temperature due to the change in threshold voltage. Due to such leakage current, it is possible that the change in voltage occurring on the supply voltage line through the operation of the threshold circuitry during the write operation may be supplemented as result of the leakage current, such that the overall change in voltage is larger than expected. This could potentially affect the memory retention functionality of any non-addressed memory cells in a selected column. In one embodiment, in order to alleviate any such concerns, the control circuitry further comprises protection diode circuitry provided for each column to couple the first voltage source to the associated supply voltage line, the protection diode circuitry operating to avoid the supply voltage on the associated supply voltage line dropping below a predetermined protection voltage level during said predetermined period of the write operation, thereby securing memory retention functionality of any non-addressed memory cells in the selected column. Hence, if for some reason the voltage on the supply voltage line drops more than expected and reaches the predetermined protection voltage level, then the forward biased protection diode circuitry will be activated to pull the voltage up so as to keep it above the predetermined protection voltage level.

The write operation may be performed in a variety of ways. However, in one embodiment the memory device further comprises at least one bit line associated with each of said at least one columns, during the write operation a change in voltage on said at least one bit line associated with the selected column indicating the data value to be stored in the addressed memory cell.

In one embodiment, said at least one bit line associated with the selected column is precharged to the first voltage level, and during the write operation the data value is indicated by lowering the voltage from the first voltage level.

In one embodiment, each column may have a single bit line associated therewith. However, in an alternative embodiment, for each column said associated at least one bit line comprises a pair of bit lines, both of the bit lines in the pair of bit lines associated with the selected column being precharged to said first voltage level. During the write operation the voltage on one of the bit lines in the pair is lowered such that the differential in voltage between the pair of bit lines indicates the data value to be stored in the addressed memory cell.

Viewed from a second aspect, the present invention provides a memory device comprising: a plurality of memory cell means arranged in at least one column, during a write operation a data value being written to an addressed memory cell means within a selected column from said at least one column; a supply voltage line means associated with each of said at least one columns, the supply voltage line means being connectable to a first voltage source means for providing a supply voltage at a first voltage level to the associated column; threshold means connected to a second voltage source means having a second voltage level, the threshold means having a threshold voltage; and control means, responsive to the write operation, for disconnecting the supply voltage line means for the selected column from the first voltage source means for a predetermined period of the write operation, and during said predetermined period for connecting the threshold means to the supply voltage line means for the selected column, such that the supply voltage to the addressed memory cell means transitions to an intermediate voltage level determined by the threshold voltage of the threshold means.

Viewed from a third aspect, the present invention provides a method of operating a memory device, the memory device having a plurality of memory cells arranged in at least one column, during a write operation a data value being written to an addressed memory cell within a selected column from said at least one column, the memory device further having a supply voltage line associated with each of said at least one columns, the supply voltage line being connectable to a first voltage source to provide a supply voltage at a first voltage level to the associated column; the method comprising the steps of: responsive to the write operation, disconnecting the supply voltage line for the selected column from the first voltage source for a predetermined period of the write operation; and during said predetermined period, connecting the supply voltage line for the selected column to threshold circuitry, the threshold circuitry having a threshold voltage and being connected to a second voltage source having a second voltage level; whereby during said predetermined period the supply voltage to the addressed memory cell transitions to an intermediate voltage level determined by the threshold voltage of the threshold circuitry.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
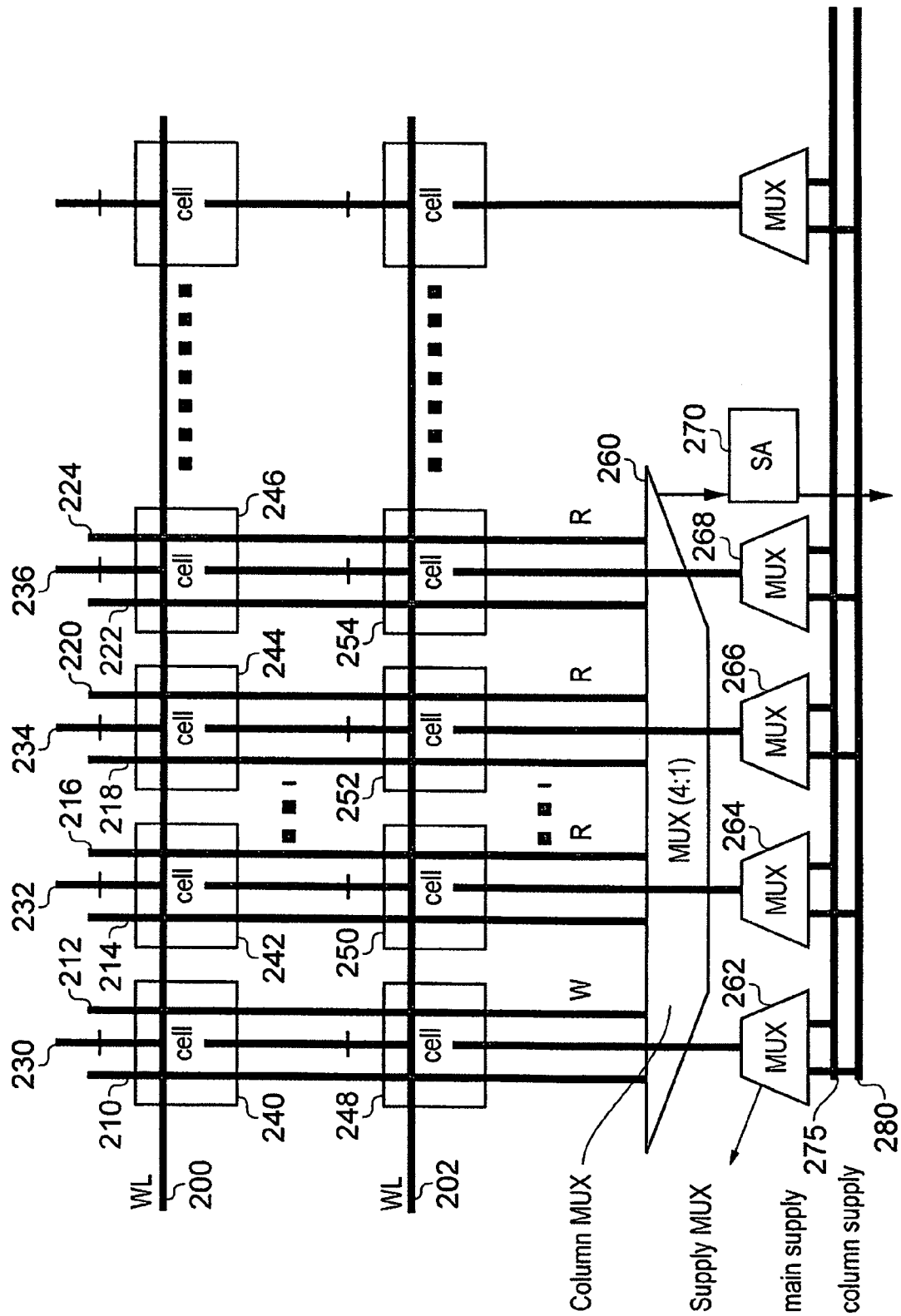
FIG. 1 is a diagram schematically illustrating a write assist mechanism in accordance with a prior art technique.
Figure 2:
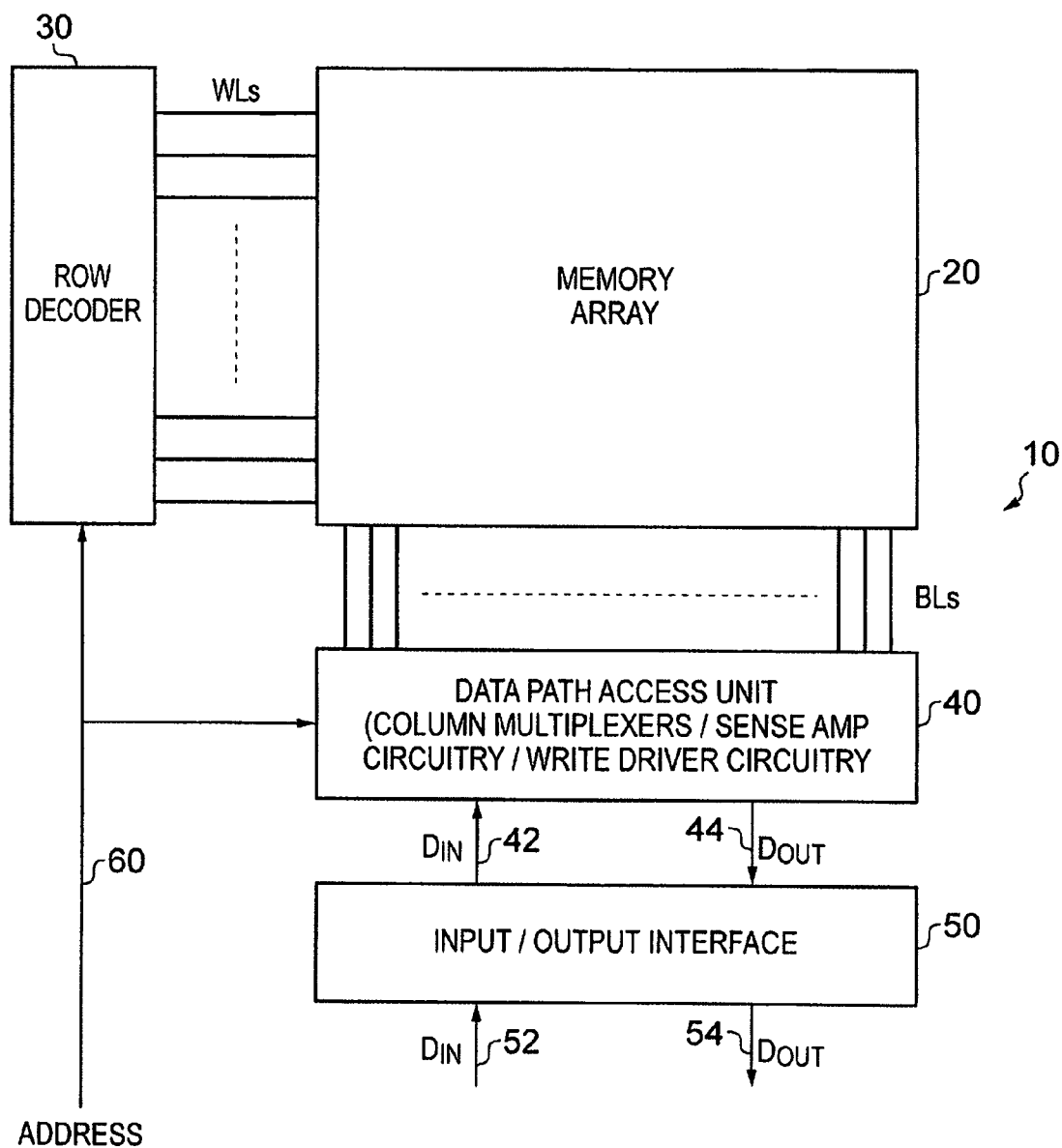
FIG. 2 is a block diagram of a memory device in which embodiments of the present invention may be employed.

FIG. 2 is a block diagram of a memory device. The memory device 10 has a memory array 20 consisting of a plurality of memory cells arranged in rows and columns. Each row has a word line (WL) connected thereto, and each column has at least one bit line (BL) connected thereto, the exact number of bit lines connected to each column being dependent on the implementation. In one example implementation, the memory array consists of SRAM cells, and a pair of bit lines are connected to each column of cells.

When a memory access request is received by the memory device, the address specified by the memory access request is routed over path 60 to a row decoder 30 and to a data path access unit 40. The row decoder 30 is arranged to decode the address and dependent thereon drive a control signal over one of the word lines in order to select one of the rows within the memory array 20. Similarly, the data path access unit 40 is arranged dependent on the address to identify the column or columns containing the data to be accessed, and to activate the respective bit lines.

Typically each memory cell stores a single bit data value, and accordingly if the data being accessed is a multi-bit data word (e.g. 32 bits, 64 bits, etc), it will be necessary to access multiple memory cells. In a typical design, column multiplexers will be provided corresponding to each bit of the data word, each column multiplexer being connected to the bit lines for a plurality of columns containing memory cells in which the associated bit of the data word can be stored. The memory array can hence be considered to be formed of a plurality of sections, one for each column multiplexer. Hence, by way of example a memory array may have 512 word lines, a multiplexer size of 4 (meaning 4 columns are connected to each multiplexer), and a data word size of 32 bits (meaning there are 32 column multiplexers, each column multiplexer being connected to a corresponding section of the memory array). Such a memory can hence store 2048 32-bit data words.

For a read operation, the relevant word line is enabled via the row decoder, the appropriate bit lines are activated by being selected via the column multiplexers, and then sense amplifier circuitry is used to observe variation on the voltage of the bit lines in order to determine for each addressed memory cell the bit value stored therein. In particular, considering the earlier-mentioned SRAM example where a pair of bit lines are connected to each memory cell, these bit lines will initially be precharged to a power supply voltage level, and when the relevant row of cells are selected via a drive signal on the relevant word line, one of the pair of bit lines connected to an addressed memory cell will start to discharge towards a ground voltage level, which of the bit lines in the pair discharges being dependent on the bit value stored therein. For each addressed memory cell (one addressed memory cell per column multiplexer), the discharging of one of the bit lines in the pair is sensed by the sense amplifier circuitry, which then produces an output signal over path 44 indicating the data word stored in the addressed memory cells. The output signal is then routed via the input/output interface 50 over path 54 to be returned as the read data to the source of the read access request.

For a write access request, the row decoder 30 operates in the same manner to select the relevant row by issuing a drive signal on the associated word line, and then for each section of the memory array write driver circuitry in the data path access unit 40 is used to alter the voltage on the relevant bit line or bit lines in order to cause the state held in the addressed memory cells to be updated to reflect the data word being written. Hence, the write data is routed over path 52 to the input/output interface 50 and from there over path 42 to the data path access unit 40. The write data will then be used to generate the appropriate control signals for the write driver circuitry to cause the voltage on the relevant bit lines to be altered to cause the state of the addressed memory cells to be updated. Hence, again considering the earlier-mentioned SRAM example, both of the bit lines associated with a particular addressed memory cell will initially be precharged, and dependent on the data to be written, one of the bit lines in the pair will be discharged by the write driver circuitry to cause the state in the addressed memory cell to be updated.

Figure 3:
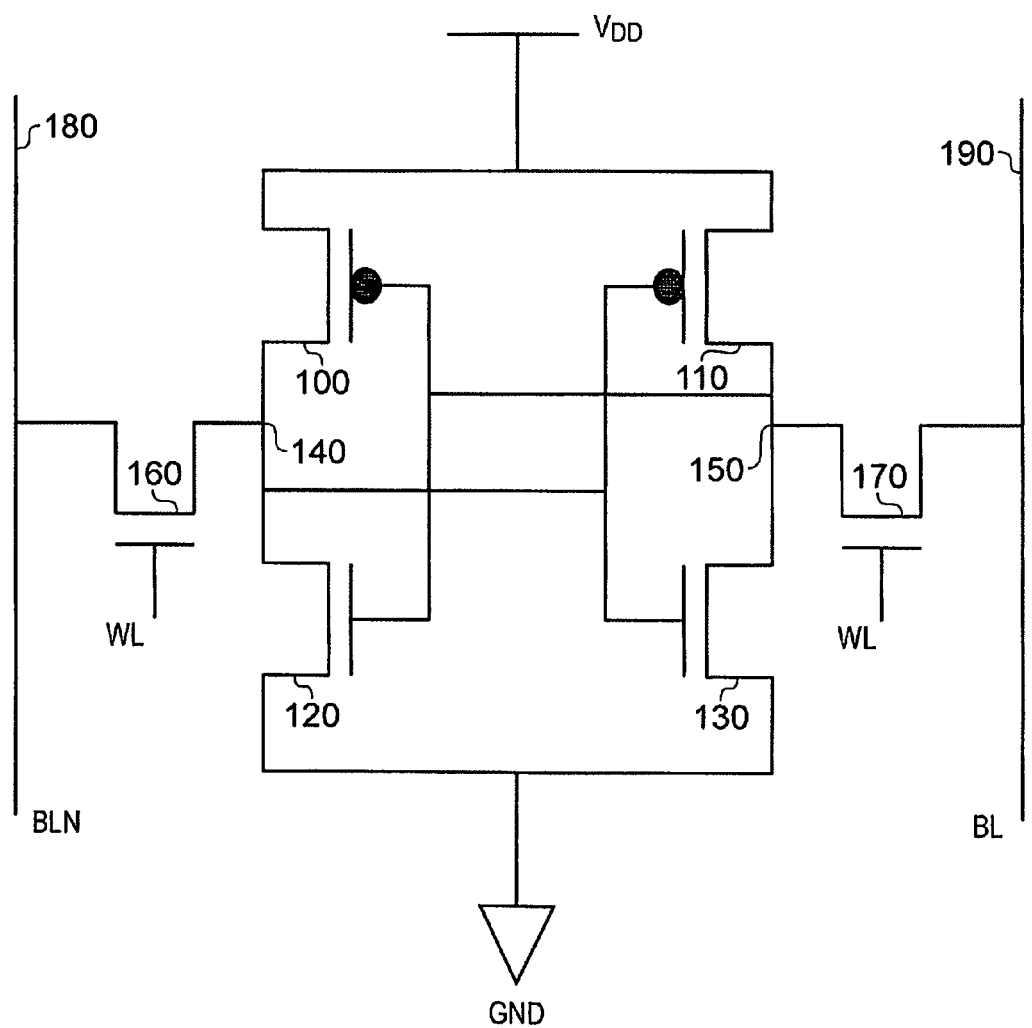
FIG. 3 is a diagram illustrating an example construction of a memory cell that may be used with the memory array of FIG. 2.

The memory cells of the memory device can take a variety of forms. However, by way of example, FIG. 3 is a diagram illustrating an example construction of a 6T SRAM memory cell that may be used in an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The bit line 180 is connected to the node 140 via an access transistor 160, and similarly the bit line 190 is connected to the node 150 via an access transistor 170.

Two different states can be stored within the memory cell shown in FIG. 3, a first state being where the node 140 is at a ground potential and the node 150 is at a power supply potential $V_{DD}$, and the second state being a state where the node 140 is at the power supply potential $V_{DD}$ and the node 150 is at the ground potential.

As mentioned previously, in modern technologies, it is becoming more and more difficult to produce memory devices where the individual memory cells have the required stability to ensure reliable retention of data, whilst also having required write-ability to ensure that new data values can be stored in the cells within the time period allowed for a write operation. For some cells the write-ability problem cannot be addressed even by increasing the write time, since for such cells the internal flipping of the state required to store a new data value may never occur even with unlimited time.

In accordance with embodiments of the present invention, diode circuitry (illustrated schematically in FIG. 4 by the diode 340) is used during the write operation to discharge the voltage on the power supply voltage line 300 to an intermediate voltage level lower than the usual power supply voltage level 320. As a result of this drop in voltage supplied to the addressed memory cell, the stability of the addressed memory cell is reduced, thereby assisting the write operation.

Figure 4:
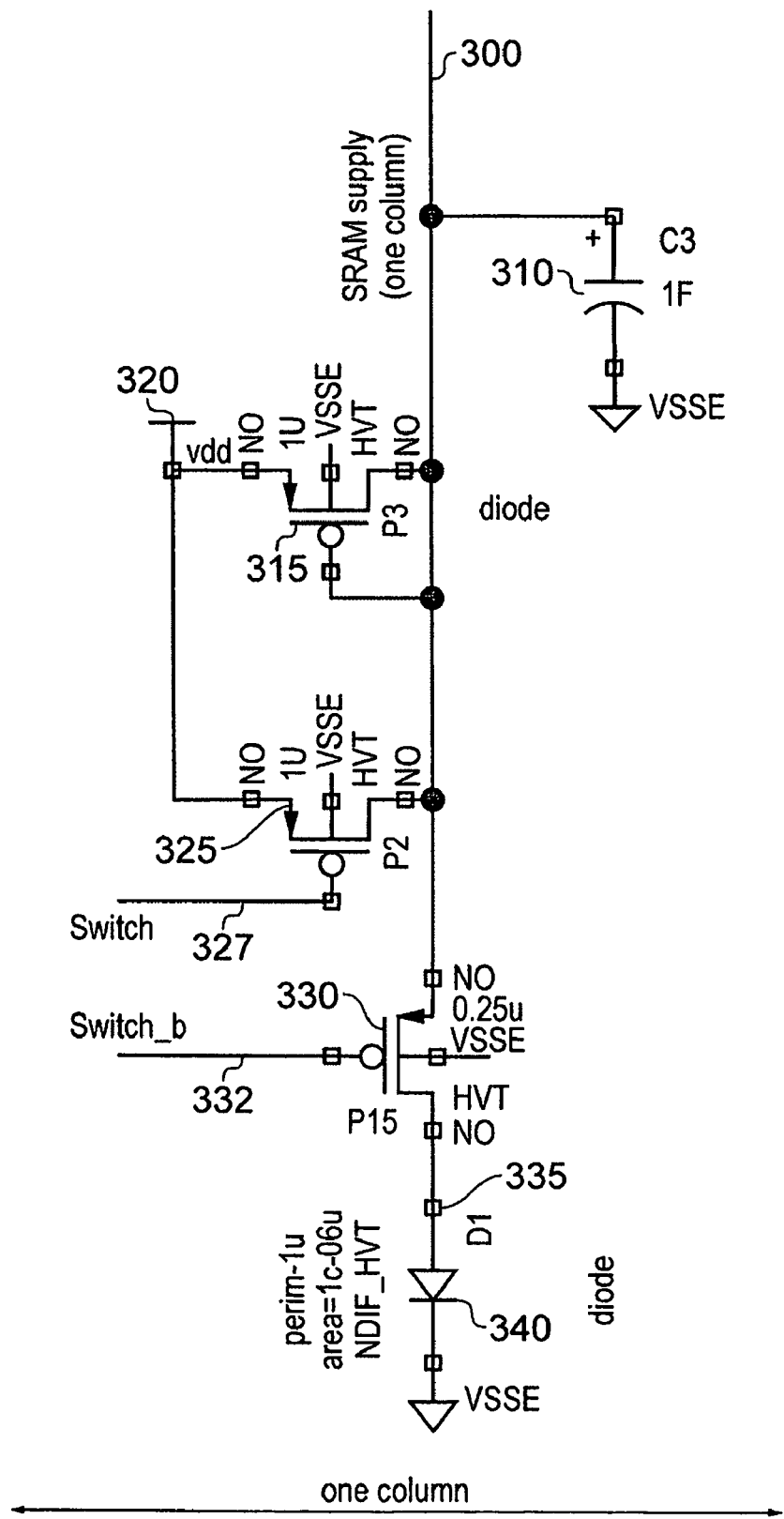
FIG. 4 is a diagram schematically illustrating a power supply voltage line for a particular column, along with associated threshold circuitry and control circuitry, in accordance with one embodiment of the present invention.

Considering FIG. 4 in more detail, FIG. 4 illustrates for one column of memory cells various components used to implement the write assist mechanism of embodiments of the present invention. As shown in FIG. 4, each power supply voltage line 300 has a capacitance, illustrated schematically in FIG. 4 by the capacitance 310 existing between the power supply voltage line 300 and ground. In order to lower the voltage on the power supply voltage line, it is necessary to discharge this capacitance, and in accordance with one embodiment of the present invention this is achieved by selectively connecting the diode 340 to the power supply voltage line 300 for at least a predetermined part of the write operation. Since the diode 340 is forward biased, it will quickly then discharge the power supply voltage line 300 towards ground, this process continuing until the threshold voltage of the diode 340 is reached, at which point the node 335 will be at an intermediate voltage level, this intermediate voltage level then forming the supply voltage to the addressed memory cell connected to the power supply voltage line 300.

Control circuitry in the form of PMOS transistors 325 and 330 is provided for selectively controlling the connection of the power supply voltage line 300 to either the power rail $V_{DD}$ 320 or to the diode circuitry 340. Typically, a logic zero value will be provided over the switch line 327 to the PMOS transistor 325, so that the power supply voltage line 300 is connected to the power supply, and accordingly the voltage on the power supply voltage line 300 is $V_{DD}$. Since the signal provided over path 332 to the other PMOS transistor 330 of the control circuitry is the inverse of the signal on path 327, then it will be seen that typically a logic one value will be provided to the PMOS transistor 330, thereby disconnecting the diode circuitry 340 from the power supply voltage line 300.

However, as will be discussed in more detail with reference to FIG. 5, when employing the write assist mechanism of an embodiment of the present invention, a logic one value is provided over the switch path 327 to switch off the transistor 325, thereby disconnecting the power supply voltage line 300 from the power supply 320. At the same time, the transistor 330 is turned on so as to connect the power supply voltage line 300 to the diode 340. As a result of these steps, the voltage on the power supply voltage line 300 quickly discharges through the diode 340 until an intermediate voltage level is reached at the node 335. This reduction in voltage lowers the stability of the addressed memory cell, hence assisting completion of the write operation.

As shown in FIG. 4, an optional forward biased diode 315 (in this case implemented by a PMOS transistor whose gate input is coupled to the power supply voltage line 300) can be used to guarantee that a minimum voltage level is retained on the power supply voltage line 300, thereby avoiding the voltage on the power supply voltage line dropping below a predetermined protection voltage level. This can be useful in securing the memory retention functionality of any non-addressed memory cells in a selected column. In particular, leakage current might cause the voltage level on the power supply voltage line 300 to drop to a level below that expected purely as a result of using the diode circuitry, and this can become significant particularly when operating at high temperatures where leakage current increases. A diode formed by a transistor 315 will typically have a threshold voltage of about 200 mV, and accordingly, by way of example, if the power supply rail 320 is at 1 V this will ensure that the forward biased diode will start to operate to pull the voltage up if the voltage on the power supply voltage line 300 reaches approximately 0.8V. The voltage on the power supply voltage line may be pulled below this voltage by the operation of the diode 340 but will retain a voltage level sufficient to ensure the memory retention functionality of the non-addressed memory cells, whilst allowing the voltage supply level to drop sufficiently to assist the write operation in the addressed memory cell.

Figure 5:
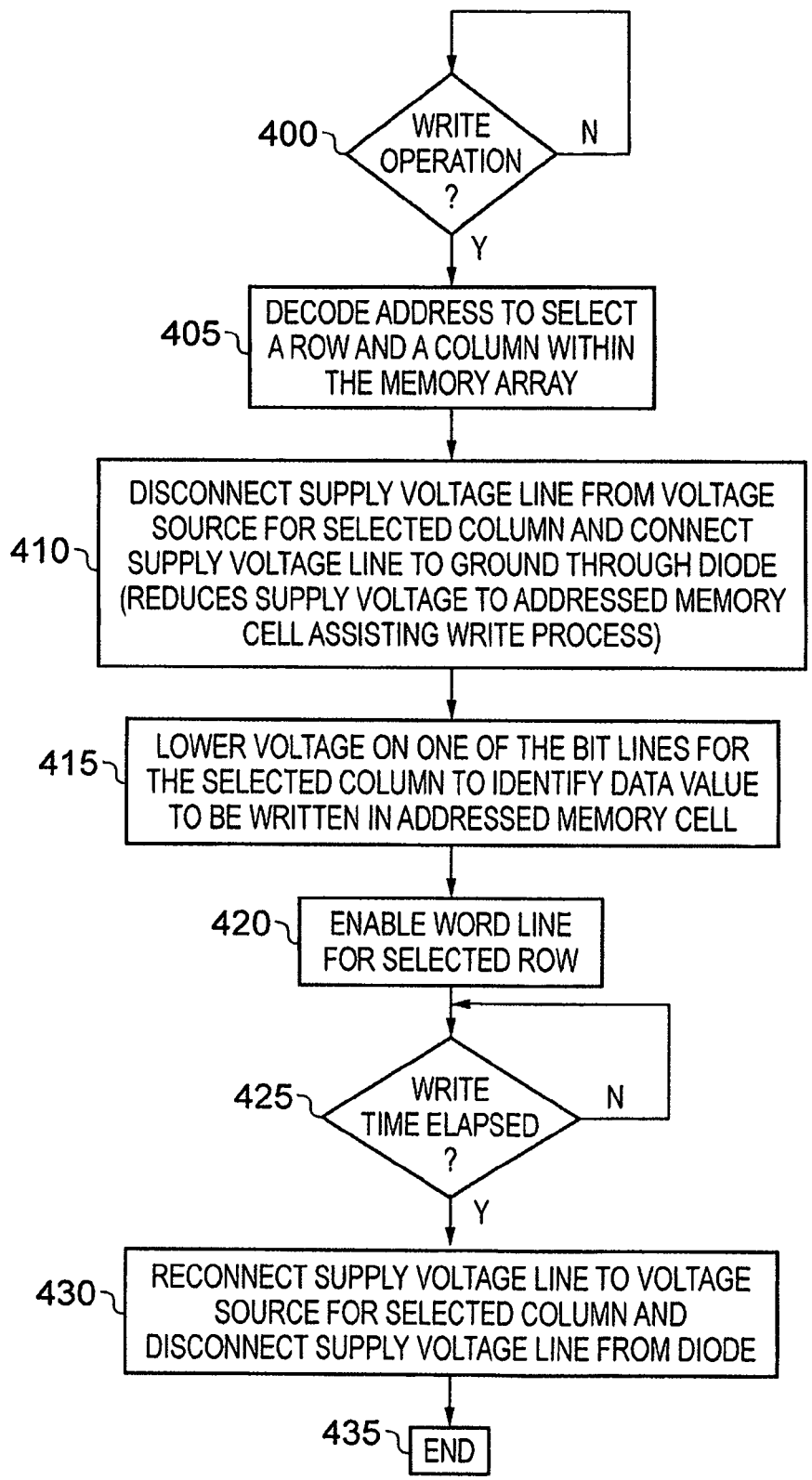
FIG. 5 is a flow diagram illustrating the operation of the write assist mechanism in accordance with one embodiment of the present invention.

FIG. 5 is a flow diagram illustrating the write assist mechanism in accordance with one embodiment of the present invention. At step 400, the occurrence of a write operation is awaited, and when a write operation is to take place, the process proceeds to step 405, where the address specified by the write operation is decoded to select a row and a column within the memory array. At step 410, the power supply voltage line 300 is disconnected from the voltage source 320 for the selected column by driving a logic one value over path 327 to the relevant PMOS transistor 325 to turn that transistor off. At the same time, a logic zero value is driven over path 332 to the PMOS transistor 330 to turn that transistor on and hence connect the power supply voltage line 300 to ground through the diode circuitry 340. As discussed earlier, this process reduces the supply voltage to the addressed memory cell thereby destabilizing the memory cell.

At step 415, the voltage on one of the bit lines for the selected column is lowered to identify the data value to be written in the addressed memory cell, and at step 420 the word line for a selected row is enabled. It will be appreciated that whilst steps 415 and 420 are shown sequentially, these steps can be performed at least partly in parallel. Indeed, both of these steps can also be performed at least partly in parallel with step 410.

At step 425, it is determined whether the write time has elapsed. Typically, a predetermined write time will be associated with the memory device, which will be set having regard to the expected write time under worst case conditions in the memory cell. Once the write time has elapsed, the process proceeds to step 430, where a logic zero value is provided over the switch path 327 to reconnect the power supply voltage line 300 to the voltage source 320 for the selected column. Additionally, a logic one value is provided over the switch path 332 to turn off the transistor 330, and disconnect the power supply voltage line 300 from the diode 340. As a result, the voltage on the power supply voltage line 300 will charge back up to the normal operating supply voltage $V_{DD}$. Thereafter, the process ends at step 435.

Figure 6:
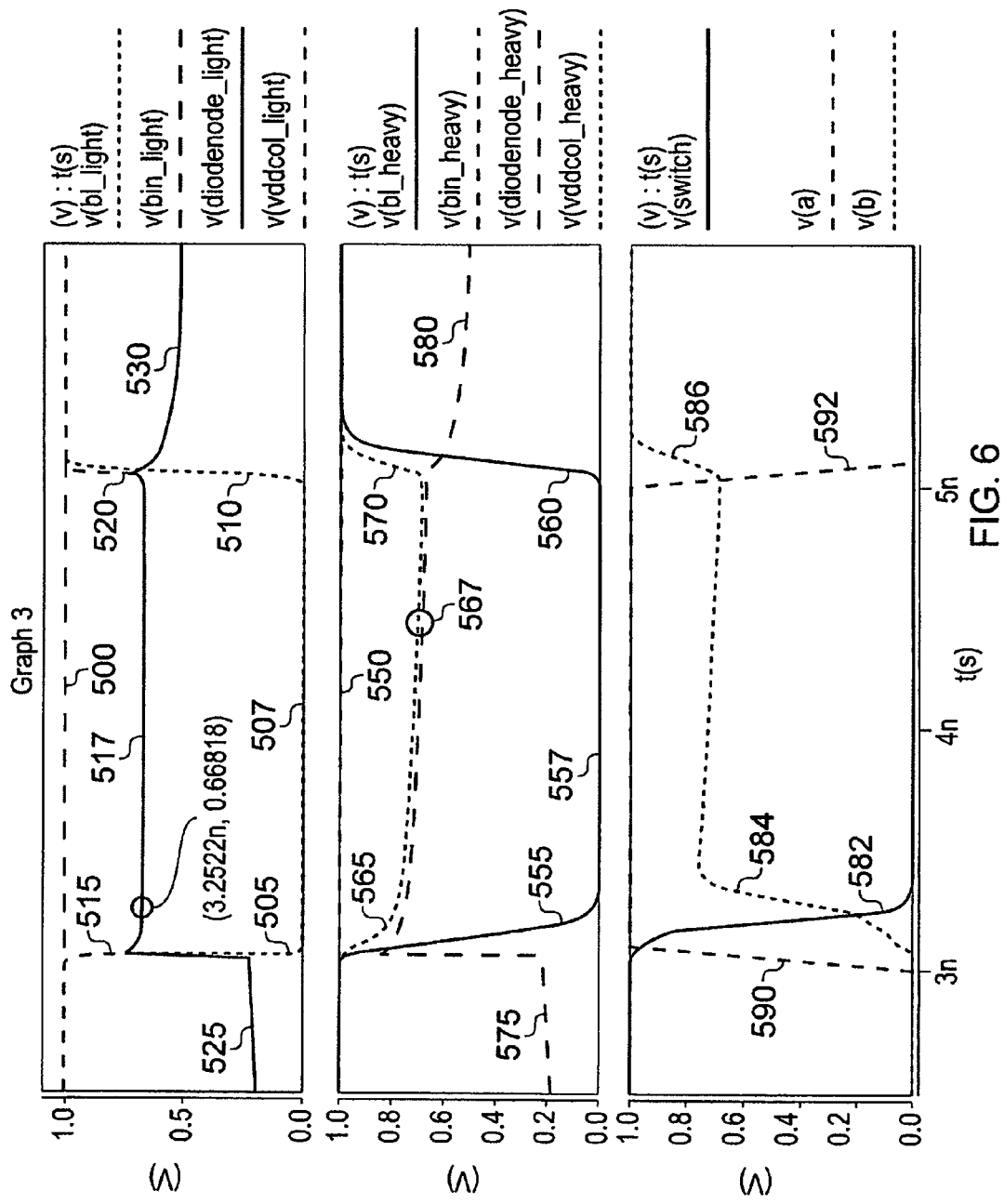
FIG. 6 is a sequence of graphs illustrating the electrical behaviour of the memory device when using the write assist mechanism of one embodiment of the present invention.

FIG. 6 is a sequence of graphs illustrating the electrical behaviour of the relevant parts of the memory device when adopting the write assist mechanism of an embodiment of the present invention. The top graph of FIG. 6 shows the voltage on the pair of bit lines for the selected column, the corresponding voltage on the power supply voltage line, and the associated voltage at the diode node 335, for a small memory matrix with short bit lines, for example four memory cells per column. In contrast, the second graph shows the same signals for a larger memory matrix with long bit lines, for example 128 memory cells per column. As can be seen from the top graph, whilst voltage 500 on one of the bit lines is maintained at $V_{DD}$, during the write operation the voltage on the other bit line discharges as shown by line 505 to the logic zero level 507, and is then charged back up to $V_{DD}$ at the end of the write operation (as shown by line 510). During the write operation, the connection of the power supply voltage line 300 to ground through the diode circuitry 340 causes the voltage on the power supply voltage line to drop as shown by the line 515 until it reaches the level indicated by line 517. During the same period, the voltage at the diode node 335, which is initially at the level shown by line 525, increases until it also reaches the point 517, at which time the voltage on the power supply voltage line 300 is the same as the voltage at the diode node 335, i.e. is at the earlier mentioned intermediate voltage level. At the end of the write operation, when the power supply voltage line is reconnected to $V_{DD}$, the voltage on the power supply voltage line increases as shown by line 520 back up to the $V_{DD}$ voltage level, whilst the voltage at the diode node 335 starts to reduce as shown by the line 530.

As can be seen by comparison of the second graph with the first graph, again one bit line drops as shown by the lines 555, 557, 560, whilst the other bit line is retained at $V_{DD}$ as shown by the line 550. In a similar manner to that discussed earlier with reference to the first graph, the voltage of the power supply voltage line 300 follows the path 565, 567, 570, whilst the voltage at the diode node 335 follows the line 575, 567, 580. Since for the larger memory matrix the power supply voltage line 300 will have a larger capacitance, it takes slightly longer for the diode circuitry 340 to discharge the voltage on the power supply voltage line, but there is still a significant drop in voltage level during the early part of the write operation. Hence the reduction in the stability of the addressed memory cell is similar in both situations, and this allows the voltage levels of the internal nodes of a cell being written to flip quickly for both large and small memory arrays.

The bottom graph in FIG. 6 shows the value of the switch signal over path 327, and the corresponding voltages at the two internal nodes 140, 150 (see FIG. 3) of the addressed memory cell. The switch signal goes high at step 590 in order to decouple the power supply voltage line 300 from the power supply 320. At this time, the inverse of that signal will also cause the transistor 330 to turn on and accordingly connect the diode 340 to the power supply voltage line 300, thereby initiating the voltage lowering operation. Following this step, it is assumed that the write operation is causing a change in state within the addressed memory cell, as a result of which the voltage on one of the internal nodes drops as shown by line 582, whilst the other one rises as shown by line 584. As can be seen, this flip in voltage levels of the internal nodes occurs early on in the voltage lowering operation.

However, for the internal node that is rising towards $V_{DD}$, it can be seen that the level achieved does not reach $V_{DD}$ during the time that the power supply voltage line is decoupled from the power source, due to the lower voltage level on the power supply voltage line. Only when the switch signal returns to a logic zero level (see line 592), and accordingly the power supply voltage line is pulled back up to $V_{DD}$, does the internal node voltage also get pulled up to $V_{DD}$, as shown by line 586.

The write enable signal to the relevant one of the write transistors used to discharge the appropriate bit line during the write operation, and the word line trigger signal used to enable the relevant word line, will also be asserted and de-asserted at the same time as the switch signal, and hence will follow lines 590, 592 as shown in FIG. 6.

Figure 7:
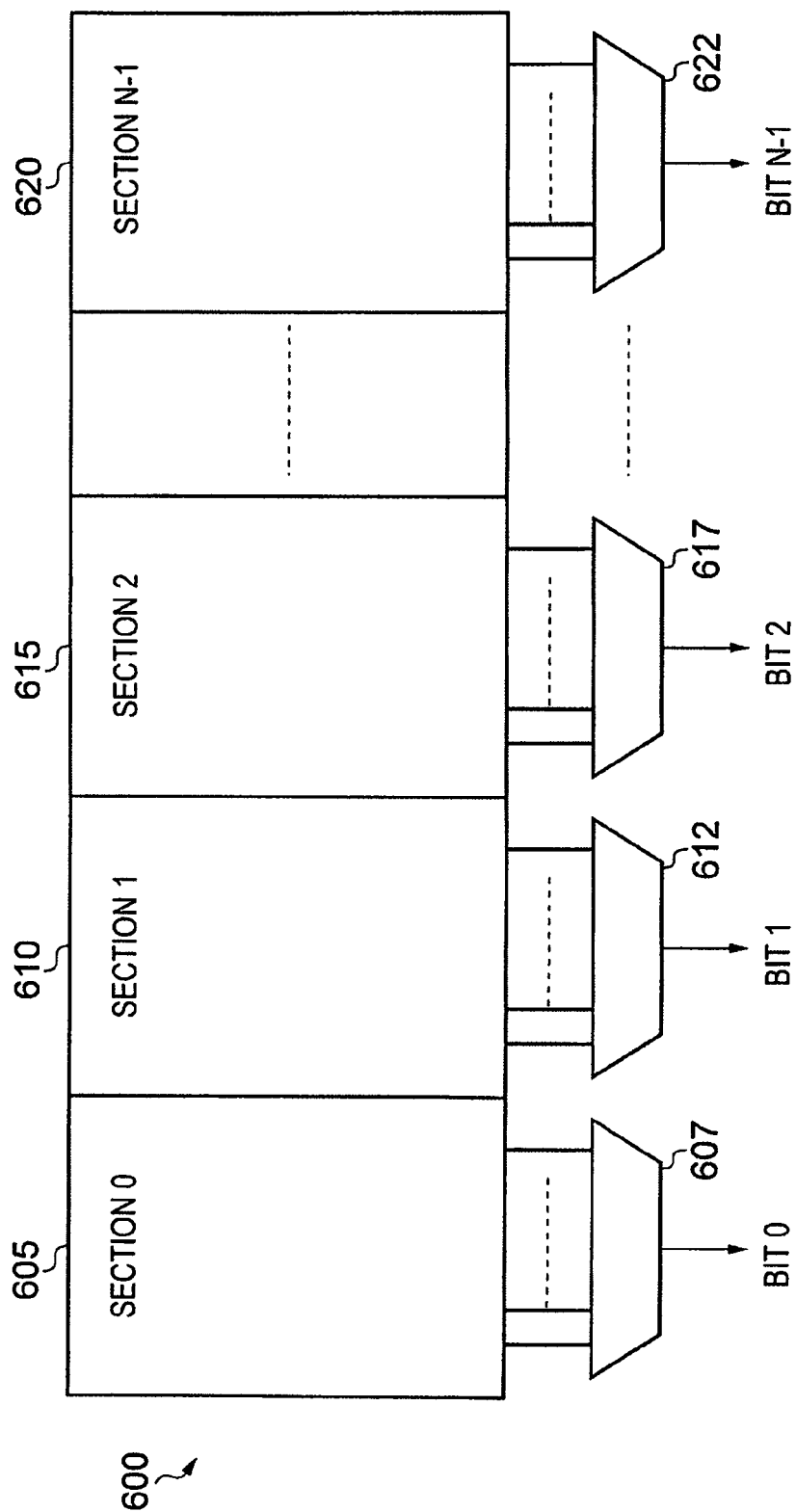
FIG. 7 schematically illustrates the various sections, and associated column multiplexers, that may be provided within a memory device.

FIG. 7 schematically illustrates a memory array 600, and in particular shows the various sections 605, 610, 615, 620 that may be provided within the memory array 600. Each section will typically comprise a plurality of columns containing memory cells in which an associated bit of a data word can be stored, and separate column multiplexers 607, 612, 617, 622 will be associated with each section 605, 610, 615, 620, respectively. As an example, if 32 bit data words are stored in the memory array, then the memory array 600 may contain 32 sections, with each section storing one of the bits of each data word.

Figure 8:
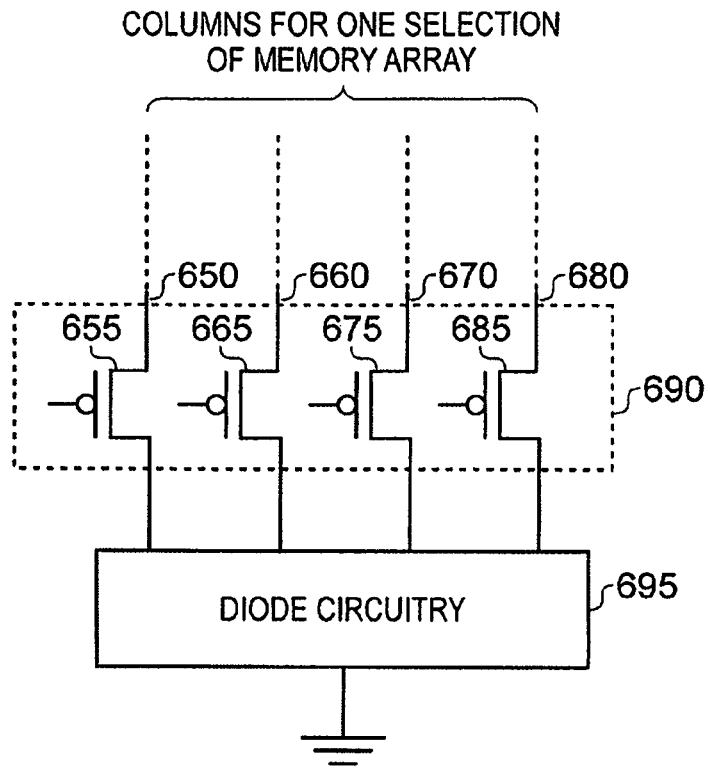
FIG. 8 illustrates an embodiment of the present invention where diode circuitry is shared amongst the columns of each section of the memory array.

As shown schematically in FIG. 4, the diode circuitry 340 used in embodiments of the present invention may be provided separately for each column within the memory array, and accordingly may be provided multiple times within each section of the memory array, i.e. in association with each column within each section of the memory array. However, in an alternative embodiment, as shown schematically in FIG. 8, the diode circuitry 695 is shared across all columns in a particular section of the memory array. Accordingly, as shown, if each section has for example four columns 650, 660, 670, 680, then each of those columns can selectively be connected via associated control transistors 655, 665, 675, 685 to a shared diode circuitry 695. Each of the transistors 655, 665, 675, 685 correspond to the transistor 330 shown in FIG. 4, and in this embodiment may be implemented by column selection transistors within the column multiplexer of the associated section (illustrated schematically in FIG. 8 by the dotted box 690).

Such an approach can provide a more efficient solution than replicating the diode circuitry for each of the columns, since it enables a larger diode to be provided, thereby typically reducing the resistance of the diode and hence enabling a higher current flow through the diode. By enabling a higher current flow, this improves the speed with which the voltage on the connected supply voltage line can be discharged to the intermediate voltage level. In particular, it will be seen that for any particular write operation only one of the column select transistors 655, 665, 675, 685 will be turned on, and accordingly the voltage on one of the connected power supply lines will be coupled via the entirety of the diode circuitry 695 to ground, thereby enabling a quick discharge of the voltage on that power supply voltage line to the intermediate voltage level.

Figure 9:
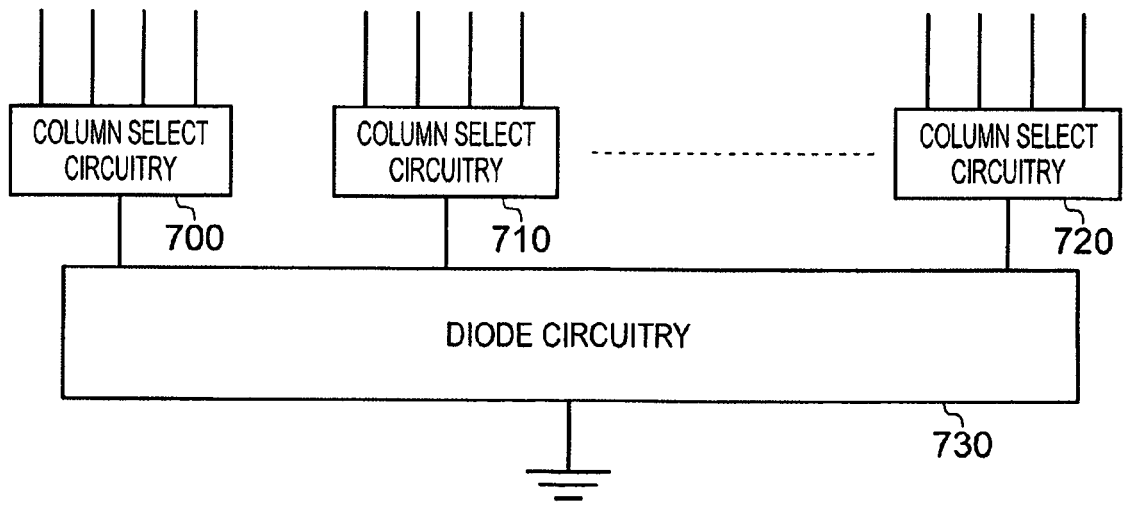
FIG. 9 illustrates an alternative embodiment of the present invention where the diode circuitry is shared across the entire memory array.

As an alternative embodiment, the diode circuitry can be shared across the entire memory array, as shown schematically in FIG. 9. In particular, as shown in FIG. 9, each of the column select circuits 700, 710, 720 associated with the various sections of the memory array are connected to common diode circuitry 730. This may simplify manufacture in certain situations, but will not typically further improve the performance of the diode circuitry when compared with the embodiment of FIG. 8, since for any particular write operation multiple power supply lines (i.e. one from each column select circuitry) will be connected to the diode circuitry 730. However, spreading the sink current in this way will be better for electro migration and self heating.

The diode circuitry used in embodiments of the present invention can take a variety of forms. However, in one embodiment the diode circuitry comprises ESD diode circuitry, which has been found to be particularly suitable for use in embodiments of the present invention. In particular, ESD diodes are designed for fast switching and have a very low impedance enabling them to readily kill/sink voltage spikes. Hence, in embodiments of the present invention an ESD diode arrangement has the ability to discharge the voltage on the supply voltage line very quickly and hence readily provide the required functionality within the relatively small period of time allowed for reducing the voltage on the supply voltage line before the writing of the addressed memory cell takes place. There is also a possibility of tuning certain parameters of the ESD diodes such as the threshold voltage and input impedance.

From the above description of embodiments of the present invention, it will be seen that the use of diode circuitry and associated control circuitry during the write operation provides a very simple and efficient write assist mechanism that can be used to improve yield by improving the number of cells that pass their functional tests. Due to the ability of the diode circuitry to draw large current, the same circuitry can operate well for both small memory designs (i.e. designs with only a few cells in each column) and large memory designs (i.e. designs with a large number of cells in each column).

The technique of embodiments of the present invention is generally applicable across a variety of technologies, and for various different kinds of memory cells. For example, the invention can be used irrespective of whether the individual memory cells are constructed using bulk CMOS (Complementary Metal Oxide Semiconductor) technology or are alternatively constructed using SOI (Silicon-On-Insulator) technology. Further, techniques of embodiments of the present invention are not only restricted to memory cells arranged as six transistor cells as shown in FIG. 3, but can apply to various other types of memory cells that facilitate the inclusion of threshold circuitry and associated control circuitry. The invention is equally applicable to memory devices that are single ported devices, or to multi-ported devices providing separate write and read paths.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A memory device comprising:
   a plurality of memory cells arranged in at least one column, during a write operation a data value being written to an addressed memory cell within a selected column from said at least one column;
   a supply voltage line associated with each of said at least one columns, the supply voltage line being connectable to a first voltage source to provide a supply voltage at a first voltage level to the associated column;
   threshold circuitry connected to a second voltage source having a second voltage level, the threshold circuitry having a threshold voltage; and
   control circuitry, responsive to the write operation, to disconnect the supply voltage line for the selected column from the first voltage source for a predetermined period of the write operation, and during said predetermined period to connect the threshold circuitry to the supply voltage line for the selected column, such that the supply voltage to the addressed memory cell transitions to an intermediate voltage level determined by the threshold voltage of the threshold circuitry.

2. A memory device as claimed in claim 1, wherein the first voltage level is a power supply voltage level, and the second voltage level is a ground supply voltage level.

3. A memory device as claimed in claim 1, wherein the plurality of memory cells are arranged as a memory array comprising a plurality of rows and a plurality of columns, during the write operation a selected row from said plurality being enabled to identify the addressed memory cell in said selected column.

4. A memory device as claimed in claim 1, wherein the threshold circuitry comprises diode circuitry.

5. A memory device as claimed in claim 1, further comprising:
   at least one bit line associated with each of said at least one columns, during the write operation a change in voltage on said at least one bit line associated with the selected column indicating the data value to be stored in the addressed memory cell.

6. A memory device as claimed in claim 2, wherein the control circuitry further comprises protection diode circuitry provided for each column to couple the first voltage source to the associated supply voltage line, the protection diode circuitry operating to avoid the supply voltage on the associated supply voltage line dropping below a predetermined protection voltage level during said predetermined period of the write operation, thereby securing memory retention functionality of any non-addressed memory cells in the selected column.

7. A memory device as claimed in claim 3, wherein the threshold circuitry is replicated for each of said plurality of columns.

8. A memory device as claimed in claim 3, wherein the memory array comprises a plurality of sections, each section having said plurality of columns and an associated column multiplexer connected to said plurality of columns, the threshold circuitry being replicated for each section but being shared amongst the plurality of columns in each section.

9. A memory device as claimed in claim 3, wherein the memory array comprises a plurality of sections, each section having said plurality of columns and an associated column multiplexer connected to said plurality of columns, the threshold circuitry being shared amongst said plurality of sections.

10. A memory device as claimed in claim 4, wherein the diode circuitry comprises an electro-static discharge (ESD) diode circuitry.

11. A memory device as claimed in claim 5, wherein said at least one bit line associated with the selected column is pre-charged to the first voltage level, and during the write operation the data value is indicated by lowering the voltage from the first voltage level.

12. A memory device as claimed in claim 11, wherein:
for each column said associated at least one bit line comprises a pair of bit lines, both of the bit lines in the pair of bit lines associated with the selected column being pre-charged to said first voltage level; and
during the write operation the voltage on one of the bit lines in the pair being lowered such that the differential in voltage between the pair of bit lines indicates the data value to be stored in the addressed memory cell.

13. A memory device comprising:
a plurality of memory cell means arranged in at least one column, during a write operation a data value being written to an addressed memory cell means within a selected column from said at least one column;
a supply voltage line means associated with each of said at least one columns, the supply voltage line means being connectable to a first voltage source means for providing a supply voltage at a first voltage level to the associated column;
threshold means connected to a second voltage source means having a second voltage level, the threshold means having a threshold voltage; and
control means, responsive to the write operation, for disconnecting the supply voltage line means for the selected column from the first voltage source means for a predetermined period of the write operation, and during said predetermined period for connecting the threshold means to the supply voltage line means for the selected column, such that the supply voltage to the addressed memory cell means transitions to an intermediate voltage level determined by the threshold voltage of the threshold means.

14. A method of operating a memory device, the memory device having a plurality of memory cells arranged in at least one column, during a write operation a data value being written to an addressed memory cell within a selected column from said at least one column, the memory device further having a supply voltage line associated with each of said at least one columns, the supply voltage line being connectable to a first voltage source to provide a supply voltage at a first voltage level to the associated column;
the method comprising the steps of:
responsive to the write operation, disconnecting the supply voltage line for the selected column from the first voltage source for a predetermined period of the write operation; and
during said predetermined period, connecting the supply voltage line for the selected column to threshold circuitry, the threshold circuitry having a threshold voltage and being connected to a second voltage source having a second voltage level;
whereby during said predetermined period the supply voltage to the addressed memory cell transitions to an intermediate voltage level determined by the threshold voltage of the threshold circuitry.

* * * * *